(12) United States Patent
Li et al.

(10) Patent No.: US 11,881,839 B2
(45) Date of Patent: Jan. 23, 2024

(54) ACOUSTIC RESONATOR ASSEMBLY AND FILTER

(71) Applicant: HANGZHOU XINGHE TECHNOLOGY CO., LTD., Zhejiang (CN)

(72) Inventors: Linping Li, Zhejiang (CN); Jinghao Sheng, Zhejiang (CN); Zhou Jiang, Zhejiang (CN)

(73) Assignee: HANGZHOU XINGHE TECHNOLOGY CO., LTD.

( * ) Notice: Subject to any disclaimer, the term of this patent is extended or adjusted under 35 U.S.C. 154(b) by 0 days.

(21) Appl. No.: 18/025,126

(22) PCT Filed: Sep. 22, 2020

(86) PCT No.: PCT/CN2020/116909
§ 371 (c)(1),
(2) Date: Mar. 7, 2023

(87) PCT Pub. No.: WO2022/056943
PCT Pub. Date: Mar. 24, 2022

(65) Prior Publication Data
US 2023/0327643 A1 Oct. 12, 2023

(30) Foreign Application Priority Data

Sep. 18, 2020 (CN) .......................... 202010990291.9

(51) Int. Cl.
*H03H 9/125* (2006.01)
*H03H 9/54* (2006.01)
(Continued)

(52) U.S. Cl.
CPC ............ *H03H 9/125* (2013.01); *H03H 9/145* (2013.01); *H03H 9/205* (2013.01); *H03H 9/25* (2013.01); *H03H 9/54* (2013.01); *H03H 9/6433* (2013.01)

(58) Field of Classification Search
CPC ........ H03H 9/125; H03H 9/145; H03H 9/205; H03H 9/25; H03H 9/54
See application file for complete search history.

(56) References Cited

U.S. PATENT DOCUMENTS

| | | | |
|---|---|---|---|
| 7,038,559 B2 * | 5/2006 | Ruby | H03H 9/605 333/192 |
| 7,378,922 B2 * | 5/2008 | Kubo | H03H 9/1092 333/133 |

(Continued)

FOREIGN PATENT DOCUMENTS

| | | |
|---|---|---|
| CN | 101009482 A | 8/2007 |
| CN | 103490743 A | 1/2014 |

(Continued)

OTHER PUBLICATIONS

Office Action issued in counterpart Japanese Patent Application No. 2023-517371 dated Oct. 6, 2023.

*Primary Examiner* — Andrea Lindgren Baltzell
*Assistant Examiner* — Alan Wong
(74) *Attorney, Agent, or Firm* — The Belles Group, P.C.

(57) ABSTRACT

An acoustic resonator assembly and a filter are disclosed. The acoustic resonator assembly includes at least two acoustic resonators vertically connected to each other. The acoustic resonator includes: an acoustic mirror, a bottom electrode layer, a piezoelectric layer, and a top electrode layer that are arranged on a substrate. An active area of the acoustic resonator is defined by an overlapping area of the acoustic mirror, the bottom electrode layer, the piezoelectric layer, and the top electrode layer. The acoustic resonator further includes a support layer arranged on the substrate or the piezoelectric layer on a periphery of a projection of the acoustic mirror on the substrate. The at least two acoustic resonators are vertically connected to each other through the support layer. The filter significantly reduces the volume and the area of a device, improves design freedom and reduces design difficulty, enhances product performance and greatly reduces costs.

19 Claims, 8 Drawing Sheets

(51) Int. Cl.
*H03H 9/205* (2006.01)
*H03H 9/25* (2006.01)
*H03H 9/145* (2006.01)
*H03H 9/64* (2006.01)

(56) References Cited

U.S. PATENT DOCUMENTS

| | | | |
|---|---|---|---|
| 7,443,270 B2 * | 10/2008 | Motai | H03H 9/587 |
| | | | 333/133 |
| 7,561,009 B2 | 7/2009 | Larson, III et al. | |
| 7,675,154 B2 | 3/2010 | Hong et al. | |
| 8,222,970 B2 | 7/2012 | Inoue et al. | |
| 8,836,449 B2 * | 9/2014 | Pang | H03H 9/0571 |
| | | | 333/187 |
| 10,458,982 B2 * | 10/2019 | Rivas | B01L 3/502715 |
| 11,206,008 B2 * | 12/2021 | Dogiamis | H03H 9/10 |
| 2002/0109564 A1 | 8/2002 | Tsai et al. | |
| 2007/0120625 A1 | 5/2007 | Larson, III et al. | |
| 2007/0170565 A1 | 7/2007 | Hong et al. | |
| 2010/0013575 A1 | 1/2010 | Inoue et al. | |
| 2012/0218056 A1 | 8/2012 | Burak | |
| 2014/0139077 A1 | 5/2014 | Choy et al. | |
| 2017/0353173 A1 | 12/2017 | Sakurai | |
| 2020/0099365 A1 | 3/2020 | Choy et al. | |

FOREIGN PATENT DOCUMENTS

| | | |
|---|---|---|
| CN | 112383286 A | 2/2021 |
| JP | 2007159123 A | 6/2007 |
| JP | 2007202130 A | 8/2007 |
| JP | 2010028371 A | 2/2010 |

* cited by examiner

Fig. 16

ACOUSTIC RESONATOR ASSEMBLY AND FILTER

CROSS-REFERENCE TO RELATED PATENT APPLICATIONS

This application is the national phase of International Application No. PCT/CN2020/116909, titled "ACOUSTIC RESONATOR ASSEMBLY AND FILTER", filed on Sep. 22, 2020, which claims priority to Chinese Patent Application No. 202010990291.9 titled "ACOUSTIC RESONATOR ASSEMBLY AND FILTER", filed on Sep. 18, 2020 with the China National Intellectual Property Administration, both of which are incorporated herein by reference in their entireties.

FIELD

The present disclosure relates to the field of communication devices, and in particular, to an acoustic resonator assembly and a filter.

BACKGROUND

With the increasingly crowded electromagnetic spectrum and the increasing frequency bands and functions of wireless communication devices, the electromagnetic spectrum used in wireless communication is grown rapidly from 500 MHz to more than 5 GHz, and a demand for a radio frequency front-end module with high performance, low cost, low power consumption and small volume is increasing. In addition, with the rapid development of wireless communication technology, the wireless communication devices are becoming more and more highly integrated and multifunctional. The development trend of the wireless communication devices promotes a miniaturization development trend of the radio frequency front-end module, and the miniaturized radio frequency front-end module further promotes the module integration and functional integration of the wireless communication devices. In addition, the miniaturized radio frequency front-end module can not only realize the miniaturization of wireless communication devices, but also increase a degree of freedom in circuit design and bring new additional value. As the radio frequency front-end module, a filter is used to improve quality of a transmission signal and a reception signal, and is mainly formed by multiple resonators connected to each other in a topological network structure. FBAR (Thin Film Bulk Acoustic Resonator) is a bulk acoustic resonator. A filter formed by the FBAR has the advantages of small volume, high integration, a high quality factor Q when operating at a high frequency, and a high power durability, and thus serves as a core device at a radio frequency front-end.

The frequency design and performance optimization of the filter are based on combination design of different resonators. The combination design and differential design of a frequency and a bandwidth are that different electrodes and different piezoelectric film thicknesses (generally two thicknesses) are first designed in an active area of each of the resonator, and the diversity of the frequency and performance of the resonator is achieved by changing the thickness. A high-performance filter may be formed by a combination of said resonators. According to the conventional technology, the resonator with two kinds of electrodes and two piezoelectric film thicknesses may be arranged on one substrate. If thicknesses of some film layers on a cavity of a resonator are adjusted on one substrate to achieve more than two thicknesses, the difficulty in design and manufacturing is greatly increased, a metal film layer stripping process (lift-oft) is required to be performed multiple times, the cost is greatly increased, the yield is reduced, and the film with a complex structure has a great impact on a structure of a top electrode, thus limiting the design.

In view of this, it is of great significance in the design of a new type of acoustic resonator assembly.

SUMMARY

In view of the above, combination and connection of resonators on one substrate are difficult, costly and low yield according to the conventional technology. An acoustic resonator assembly and a filter are provided according to the present disclosure to solve the above problems.

In a first aspect, an acoustic resonator assembly is provided according to an embodiment of the present disclosure, the acoustic resonator assembly includes at least two acoustic resonators that are vertically connected to each other. For each of the at least two acoustic resonators, an acoustic resonator includes: an acoustic mirror, a bottom electrode layer, a piezoelectric layer and a top electrode layer that are arranged on a substrate; an active area of the acoustic resonator is defined by an overlapping area of the acoustic mirror, the bottom electrode layer, the piezoelectric layer and the top electrode layer; and the acoustic resonator further includes a support layer, and the support layer is arranged on the substrate or the piezoelectric layer on a periphery of a projection of the acoustic mirror on the substrate. The at least two acoustic resonators are vertically connected to each other through the support layer.

In some embodiments, at least one of the top electrode layer and the bottom electrode layer of the acoustic resonator is provided with an outer connection part, and the outer connection part extends from at least one side of the at least one of the top electrode layer and the bottom electrode layer to an upper side of the support layer and extends to the outside through the support layer, and is connected to the outside. The outer connection unit is connected to the outside, so that multiple resonators can be connected in series with each other or in parallel with each other, and two acoustic resonators can be vertically connected in series with each other or in parallel with each other.

In some embodiments, the outer connection part extending from at least one side of the top electrode layer is in a stepped structure, and an air gap is formed by the outer connection part, the piezoelectric layer and the support layer. The air gap formed by the outer connection part, the piezoelectric layer and the support layer may prevent the transverse wave from coupling energy to the substrate, thus improving the performance of the resonator.

In some embodiments, the stepped structure of the outer connection part is provided with at least two steps. The outer connection part in different stepped structures ensures that resonators can electrically connected to each other and prevent the transverse wave from coupling energy to the substrate, thus improving the performance of the resonator.

In some embodiments, the top electrode layer of the acoustic resonator is provided with a mass load part, the mass load part is arranged on a lead wire that extends from the piezoelectric layer through the support layer, and an air gap is formed by the lead wire, the piezoelectric layer and the support layer. The mass load part is arranged on the lead wire, to form an acoustic impedance mutation area that may reflect the transverse wave, and prevent the transverse wave from coupling energy to the substrate, thus improving the performance of the acoustic resonator assembly.

In some embodiments, at least apart of a projection of the air gap on the substrate is located inside the acoustic mirror or at a boundary of the acoustic mirror. The air gap may reflect the transverse wave, and prevent the transverse wave from coupling energy to the substrate, thus improving the performance of the resonator.

In some embodiments, a top electrode layer or a lead wire connected to the top electrode layer arranged on at least one side of the acoustic resonator and a top electrode layer or a lead wire connected to the top electrode layer arranged on at least one side of the other acoustic resonator corresponding to the side of the acoustic resonator extend to a middle of the two acoustic resonators, and are connected to each other to form a suspended structure, so that the two acoustic resonators can be connected in parallel with each other.

In some embodiments, an end of the suspended structure extends towards the support layer and is not connected to the support layer. The suspended structure, the support layer and the piezoelectric layer form an air gap, and the air gap may reflect the transverse wave and prevent the transverse wave from coupling energy to the substrate, thus improving the performance of the resonator.

In some embodiments, an end of the suspended structure extends towards a middle of the active area. The end of the suspended structure extends towards the middle of the active area, so that a projection of an end of an electrode on the side in a vertical direction is located inside an acoustic mirror or coincides with a boundary of the acoustic mirror, so as to prevent the transverse wave from coupling energy to the substrate, thus improving the performance of the resonator.

In some embodiments, the air gap is filled with a material with low dielectric constant. The material with low dielectric constant may also reflect the transverse wave and prevent the transverse wave from coupling energy to the substrate, thus improving the performance of the resonator, and further improving the stability of the resonator.

In some embodiments, at least two acoustic resonators are vertically connected to each other by bonding or welding. A bonding process or a welding process is relatively mature and may effectively control the cost.

In some embodiments, at least two vertically connected acoustic resonators are bonded to each other through a bonding layer arranged on the support layer, and after two acoustic resonators are bonded to each other, a distance between a top electrode layer of one acoustic resonator and a top electrode layer of the other acoustic resonator ranges from 10 µm to 20 µm in the active area. At this distance, the top electrode layers of the vertically bonded two resonators do not affect each other.

In some embodiments, electrodes of the acoustic resonator and electrodes of another acoustic resonator are connected to each other in multiple ways, to form at least one of a series structure and a parallel structure.

In a second aspect, a filter formed by the acoustic resonator assembly according to the first aspect is further provided according to an embodiment of the present disclosure.

In some embodiments, a metal isolation layer is arranged between filters formed by two adjacent acoustic resonator assemblies arranged side by side.

In some embodiments, bottom electrode layers of acoustic resonators of two adjacent acoustic resonator assemblies arranged side by side are arranged on one layer, and connected to each other. In this case, the bottom electrode layers may achieve electrical coupling between the adjacent acoustic resonator assemblies, and may form a parallel structure.

In some embodiments, the acoustic resonator further includes a surface acoustic wave resonator, an interdigital transducer of the surface acoustic wave resonator is provided with a connection part extending from at least one side of the interdigital transducer to an upper side of the support layer and being connected to the outside, and an air gap is formed by the connection part, the substrate and the support layer, so that one surface acoustic wave resonator and another surface acoustic wave resonator can be connected in series with each other or in parallel with each other.

In some embodiments, the acoustic resonator in the filter includes at least one surface acoustic wave resonator, so that the surface acoustic wave resonator and the bulk acoustic resonator can be connected in series with each other or in parallel with each other.

An acoustic resonator assembly and a filter are provided according to the present disclosure. The acoustic resonator assembly includes at least two acoustic resonators that are vertically bonded to each other, a support layer is arranged on a substrate or a piezoelectric layer on a periphery of a projection of an acoustic mirror on the substrate, and at least two acoustic resonators are vertically bonded to each other through a bonding layer arranged on the support layer. The filter is formed by bonding, to greatly reduce an area of the filter, and thus an area of each resonator can be increased by appropriately sacrificing an area reduction rate of the resonator. Before the resonators are bonded to each other, acoustic resonators with different electrodes and different piezoelectric film thicknesses may be respectively arranged on two substrates, at least two film thicknesses of the resonator may be respectively achieved, and at least four combinations may be achieved by modifying at least one of a series resonance frequency and a parallel resonance frequency of the acoustic resonators on an upper substrate and a lower substrate. Therefore, compared with modifying at least one of the series resonant frequency and the parallel resonant frequency of all acoustic resonators on one substrate, the resonance frequencies of the acoustic resonators on two substrates are respectively modified and then the acoustic resonators are bonded to each other, so that the difficulty in design and manufacturing can be greatly reduced, and a fault tolerance rate can be improved, which can greatly improve the degree of freedom in design and the performance of the filter, simplify the process and reduce the cost.

BRIEF DESCRIPTION OF THE DRAWINGS

The drawings are included to provide a further understanding of the embodiments and are incorporated into and constitute a part of this specification. The drawings illustrate embodiments, and together with the description are used to explain the principles of the present disclosure. In this way, many expected advantages of other embodiments and this embodiment may be easily recognized, because they may be better understood by referring to the following detailed description. The elements of the drawings are not necessarily to scale to each other. The same reference numerals refer to corresponding similar parts.

DETAILED DESCRIPTION

The present disclosure is further described in detail below with reference to the drawings and embodiments. It should be understood that the specific embodiments described herein are only used to explain the related disclosure, but not to limit the present disclosure. In addition, it should be noted that, for the convenience of description, only the parts related to the related disclosure are shown in the drawings. It should be noted that the dimensions and sizes of components in the drawings are not to scale and the size of some components may be highlighted for clarity.

It should be noted that, without conflict, the embodiments of the present disclosure and features in the embodiments may be combined with each other. The present disclosure is described in detail below in conjunction with the embodiments and with reference to the drawings.

Figure 1:
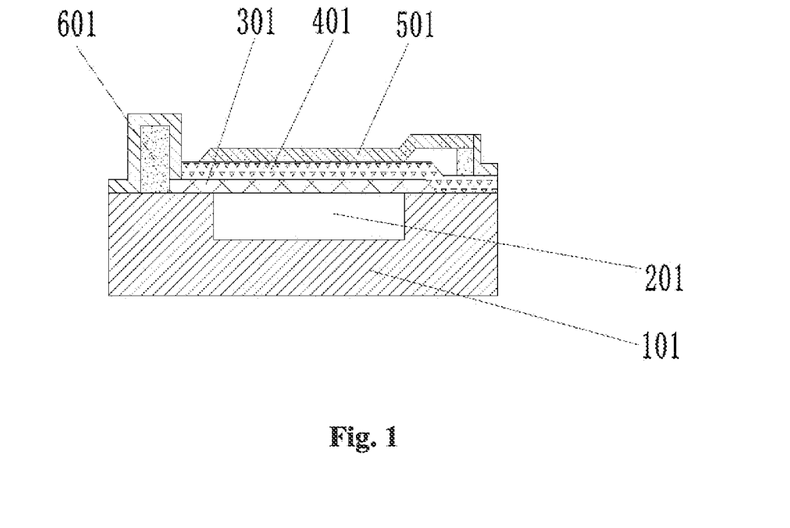
FIG. 1 is a schematic structural diagram showing an acoustic resonator assembly according to an embodiment of the present disclosure.

An acoustic resonator assembly is provided according to an embodiment of the present disclosure. The acoustic resonator assembly includes at least two acoustic resonators vertically connected to each other. As shown in FIG. 1, for each of the acoustic resonators, the acoustic resonator includes an acoustic mirror 201, a bottom electrode layer 301, a piezoelectric layer 401 and a top electrode layer 501 that are arranged on a substrate 101; an active area of the acoustic resonator is defined by an overlapping area of the acoustic mirror 201, the bottom electrode layer 301, the piezoelectric layer 401 and the top electrode layer 501; and the acoustic mirror 201 includes a cavity or a bragg reflector. In the following embodiments, the acoustic mirror 201 mainly includes the cavity. The acoustic resonator further includes a support layer 601, and the support layer 601 is arranged on the substrate 101 or the piezoelectric layer 401 on a periphery of a projection of the acoustic mirror 201 on the substrate 101. At least two acoustic resonators are vertically connected to each other through the support layer 601. The support layer 601 may ensure the mechanical stability of connection of a lower acoustic resonator and an upper inverted acoustic resonator. In an embodiment, the substrate 101 may be made of silicon/sapphire/spinel, or other materials. The support layer 601 may made of a dielectric material, such as Si/SiN/SU8/PI/$SiO_2$ or other insulating materials and low K materials (such as FSG, SiLK, BCB, Black Diamond (C-doped $SiO_2$)). The bottom electrode layer and the top electrode layer each are made of a single metal or an alloy such as Ti/Al/Cu/Au/Mo/Ru/Ni/W/Pt/TiN. The piezoelectric layer is made of a piezoelectric material, such as AlN/PZT/ZnO/$LiTaO_3$/$LiNbO_3$.

First Embodiment

Figure 2:
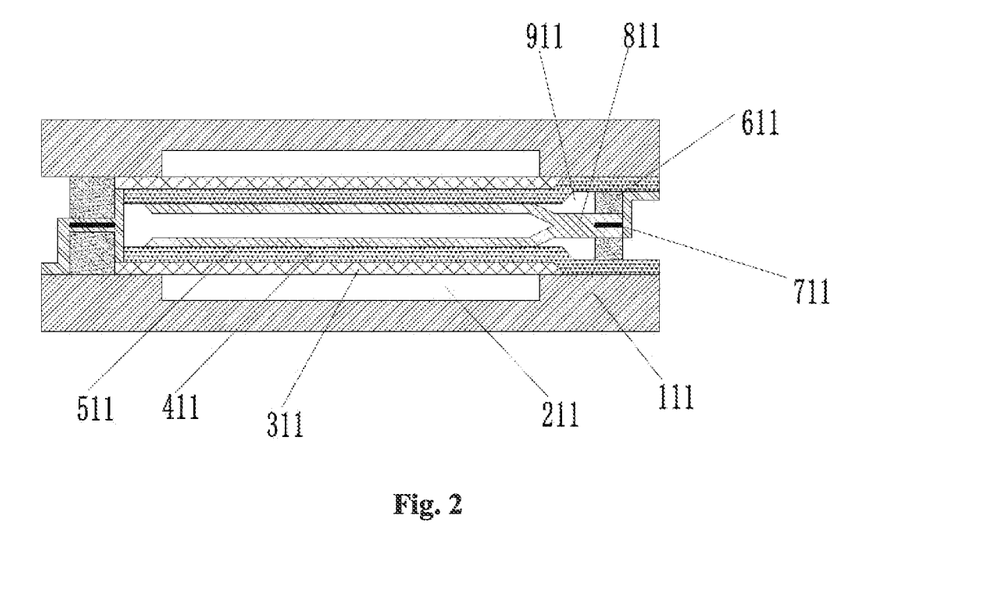
FIG. 2 is a schematic structural diagram showing that acoustic resonators in an acoustic resonator assembly are connected in parallel with each other and a support layer is arranged on a piezoelectric layer according to a first embodiment of the present disclosure.
Figure 3:
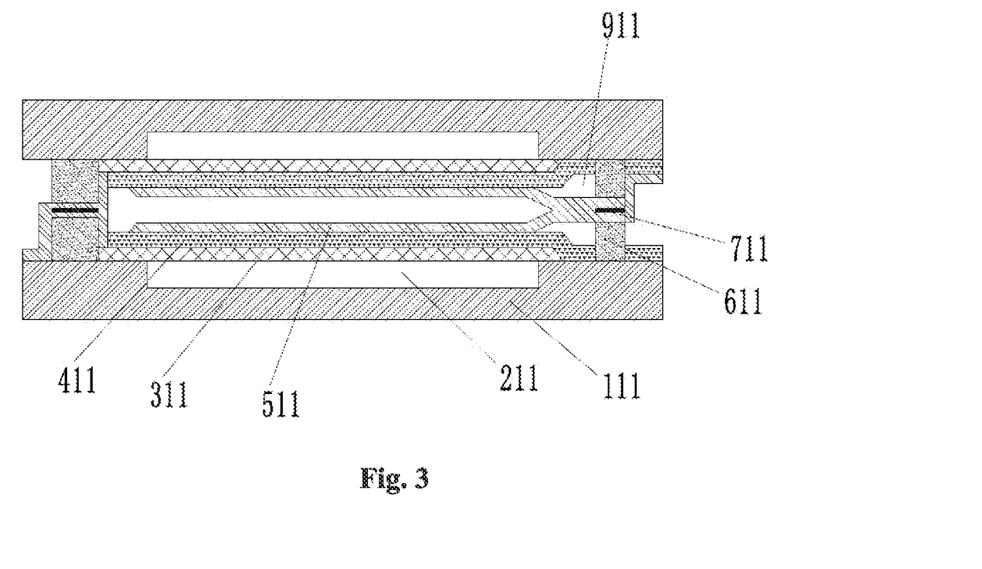
FIG. 3 is a schematic structural diagram showing that acoustic resonators in an acoustic resonator assembly are connected in parallel with each other and a support layer is arranged on a substrate according to the first embodiment of the present disclosure.

In an embodiment, at least two acoustic resonators are vertically connected to each other by bonding or welding. A bonding process or a welding process is relatively mature and the cost may be effectively controlled. In an embodiment, as shown in FIG. 2, at least two vertically connected acoustic resonators are bonded to each other through a bonding layer 711 arranged on a support layer 611. After two acoustic resonators are bonded to each other, a distance between a top electrode layer 511 of one acoustic resonator and a top electrode layer 511 of the other acoustic resonator ranges from 10 μm to 20 μm in an active area. At this distance, the top electrode layers 511 of the vertically bonded two resonators do not affect each other. In an embodiment, the bonding layer 711 is mainly made of a metal Au/Sn or bonding adhesive, to ensure the reliability of the bonding. As shown in FIG. 3, the support layer 611 may be arranged on the substrate 111. The support layer 611 is directly connected to the substrate 111. The connection between the support layer 611 and the substrate 111 has a higher mechanical stability than a connection between the support layer 611 and a piezoelectric layer 411, and the connection between the support layer 611 and the piezoelectric layer 411 can simplify the process.

Figure 4:
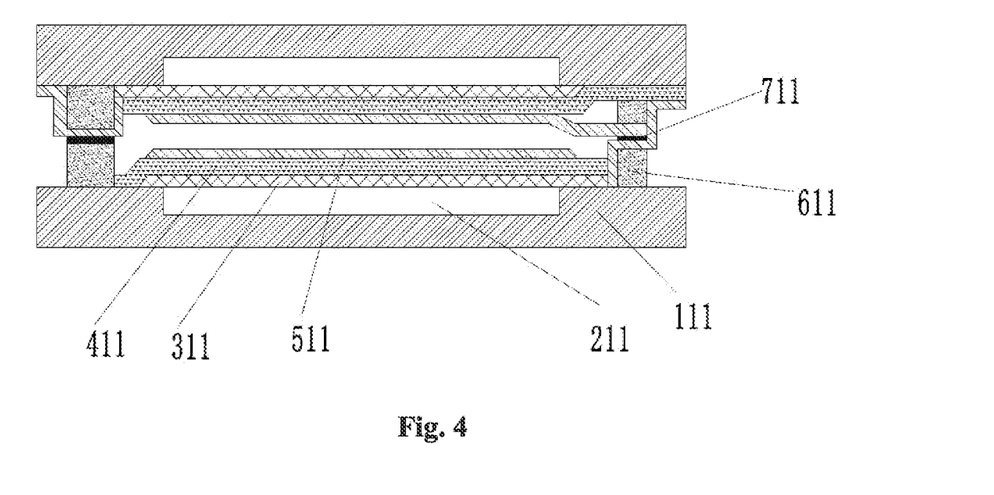
FIG. 4 is a schematic structural diagram showing that acoustic resonators in an acoustic resonator assembly are connected in series with each other according to the first embodiment of the present disclosure.

In the embodiment, as shown in FIG. 2, the top electrode layer 511 of the acoustic resonator is connected to the top electrode layer 511 of the other acoustic resonator, and a bottom electrode layer 311 of the acoustic resonator is connected to a bottom electrode layer 311 of the other acoustic resonator, thus forming a parallel structure. As shown in FIG. 4, the top electrode layer 511 of the acoustic resonator is connected to the bottom electrode layer 311 of the other acoustic resonator, and the bottom electrode layer 311 of the acoustic resonator is connected to the top electrode layer 511 of the other acoustic resonator, thus forming a series structure.

As shown in FIG. 2, the top electrode layer 511 of the acoustic resonator is provided with an outer connection part 811. The outer connection part 811 extends from at least one side of the top electrode layer 511 to an upper side of the support layer 611 and extends to the outside through the support layer 611, and is connected to the outside. The outer connection unit 811 may be connected to the outside, so that multiple resonators can be connected in series with each other or in parallel with each other, and two acoustic resonators can be vertically connected in series with each other or in parallel with each other. In an embodiment, the outer connection part 811 is in a stepped structure, and forms an air gap 911 with the piezoelectric layer 411 and the support layer 611. In an embodiment, at least a part of a projection of the air gap 911 on the substrate 111 is located inside an acoustic mirror 211 or at a boundary of the acoustic mirror 211. The air gap 911 may reflect a transverse wave and prevent the transverse wave from coupling energy to the substrate 111, thus improving the performance of the resonator. In other embodiments, the air gap 911 may be filled with a material with low dielectric constant. The material with low dielectric constant may also reflect the transverse wave and prevent the transverse wave from coupling energy to the substrate, thus improving the performance of the resonator, and further improving the stability of the resonator. The material with low dielectric constant may be the same as the material of the support layer 611, and be formed simultaneously with the support layer 611. The air gap 911 may be formed by selectively removing the material with low dielectric constant same as the material of the support layer 611 after two acoustic resonators are bonded to each other. In addition to improving the stability of the resonator, the support layer 611 may further ensure that the outer connection part 811 extends to the outside, is electrically connect to an external structure, and forms an air gap 911.

Second Embodiment

Figure 5:
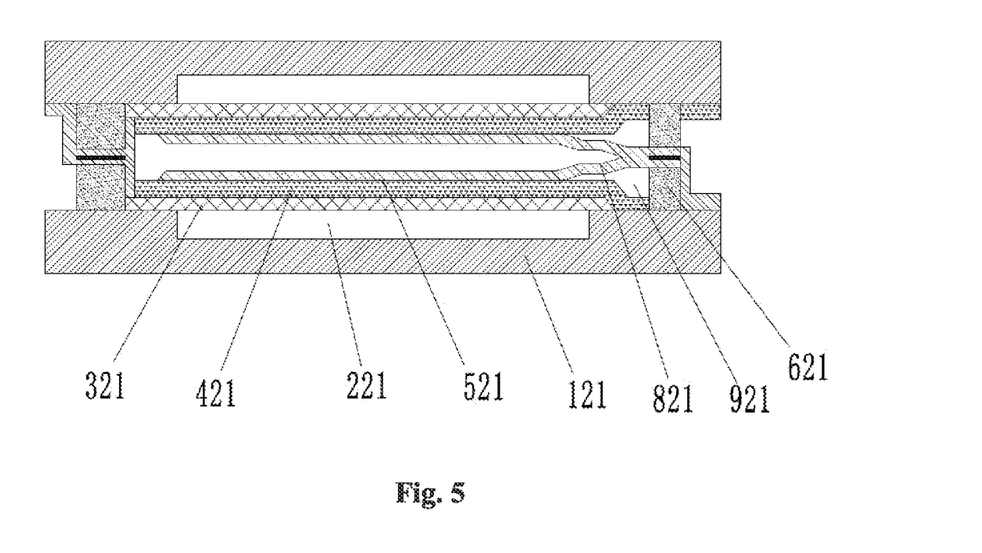
FIG. 5 is a schematic structural diagram showing that each of acoustic resonators in an acoustic resonator assembly in a parallel structure is provided with an outer connection part having two steps according to a second embodiment of the present disclosure.

The embodiment is different from the first embodiment is in that an outer connection part 821 in the stepped structure has at least two steps. In an embodiment, as shown in FIG. 5, the outer connection part 821 in the stepped structure may have two steps. In other embodiments, the outer connection part 821 in the stepped structure may have multiple steps. Similarly, the outer connection part 821 in the stepped structure is arranged to ensure that a top electrode layer 521 is electrically connected, and forms an air gap 921 with a piezoelectric layer 421 and a support layer 621. The air gap 921 may prevent the transverse wave from coupling energy to a substrate 121, thus improving the performance of the resonator. At least a part of a projection of the air gap 921 in a direction perpendicular to the substrate 121 is located inside an acoustic mirror 221 or at a boundary of the acoustic mirror 221.

Figure 6:
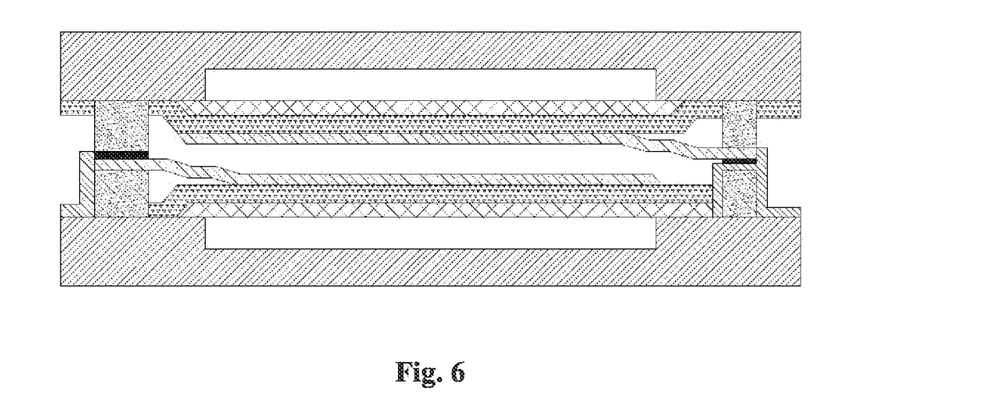
FIG. 6 is a schematic structural diagram showing that each of acoustic resonators in an acoustic resonator assembly in a series structure is provided with an outer connection part having two steps according to the second embodiment of the present disclosure.
Figure 7:
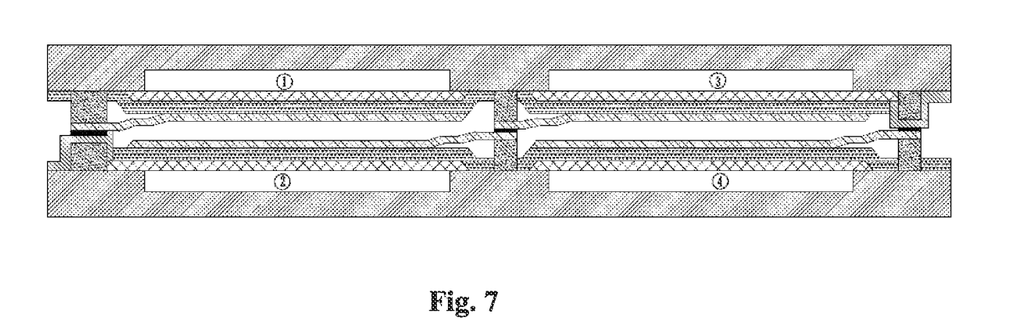
FIG. 7 is a schematic structural diagram showing that each of acoustic resonators in two acoustic resonator assemblies in a parallel structure is provided with an outer connection part having two steps according to the second embodiment of the present disclosure.

In some embodiments, FIG. 5 shows a parallel structure formed by bonding an upper acoustic resonator to a lower acoustic resonator, FIG. 6 shows a series structure formed by bonding an upper acoustic resonator to a lower acoustic resonator, and FIG. 7 shows a parallel structure formed by an acoustic resonator assembly and another acoustic resonator assembly, where an acoustic resonator ① is connected in series with an acoustic resonator ②, and the acoustic resonator ② is connected in parallel with an acoustic resonator ③, and the acoustic resonator ③ is connected in series with an acoustic resonator ④.

Third Embodiment

Figure 8:
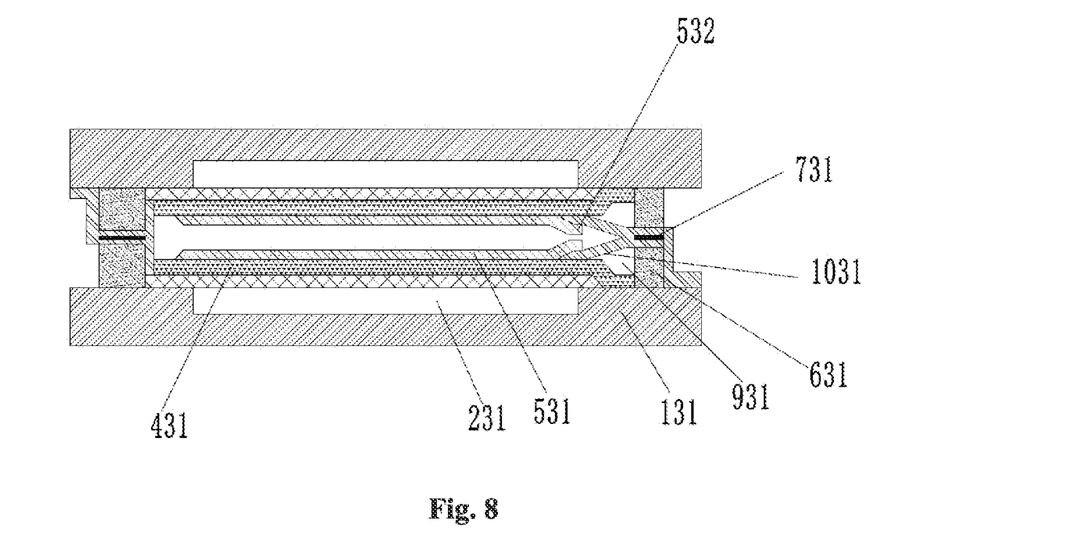
FIG. 8 is a schematic structural diagram showing that acoustic resonators in an acoustic resonator assembly are connected in parallel with each other according to a third embodiment of the present disclosure.
Figure 9:
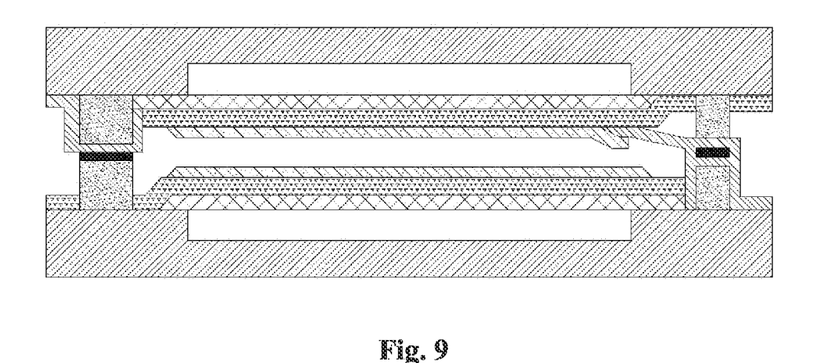
FIG. 9 is a schematic structural diagram showing that acoustic resonators in an acoustic resonator assembly are connected in series with each other according to the third embodiment of the present disclosure.

The embodiment is different from the first embodiment is in that as shown in FIG. 8, a top electrode layer 531 of the acoustic resonator is provided with a mass load part 532. The mass load part 532 is arranged on a lead wire 1031 that extends from a piezoelectric layer 431 through a support layer 631. The lead wire 1031 forms an air gap 931 with the piezoelectric layer 431 and the support layer 631. The lead wire 1031 above the support layer 631 is formed between the support layer 631 and a bonding layer 731. At least a part of a projection of the air gap 931 on a substrate 131 is located inside an acoustic mirror 231 or at a boundary of the acoustic mirror 231. The mass load part 532 is arranged on the lead wire 1031, to form an acoustic impedance mutation area that may reflect the transverse wave, and prevent the transverse wave from coupling energy to the substrate 131, thus improving the performance of the resonator. In the embodiment, FIG. 8 shows a parallel structure formed by bonding an upper acoustic resonator to a lower acoustic resonator, and FIG. 9 shows a series structure formed by bonding an upper acoustic resonator to a lower acoustic resonator.

Fourth Embodiment

Figure 10:
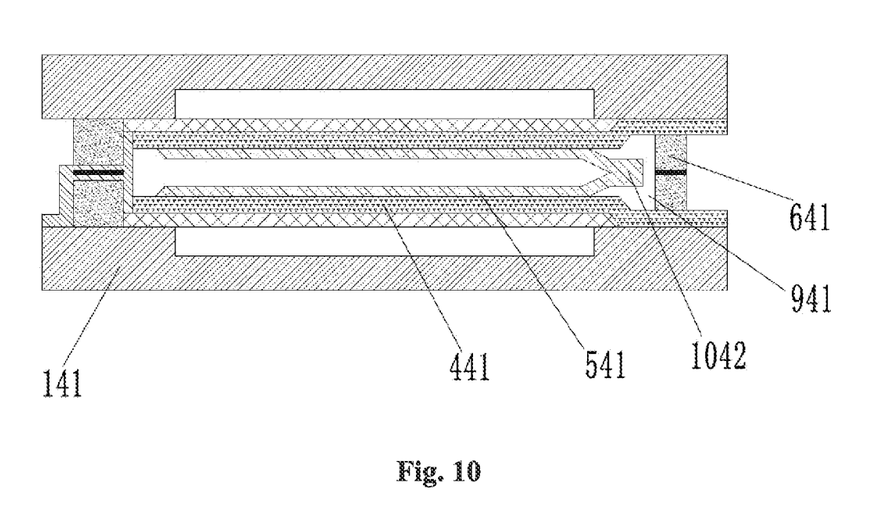
FIG. 10 is a schematic structural diagram showing that acoustic resonators are provided with a suspended structure extending towards a support layer in an acoustic resonator assembly according to a fourth embodiment of the present disclosure.

The embodiment is different from the first embodiment is in that, as shown in FIG. 10, a top electrode layer 541 or a lead wire 1041 connected to the top electrode layer 541 arranged on at least one side of the acoustic resonator and a top electrode layer 541 or a lead wire 1041 connected to the top electrode layer 541 arranged on at least one side of the other acoustic resonator corresponding to the side of the acoustic resonator extend to a middle of the two acoustic resonators, and are connected to each other to form a suspended structure 1042. The top electrode layers 541 of the vertically bonded two acoustic resonators are connected to each other to form the suspended structure 1042, so that the two acoustic resonators can be connected in parallel with each other. As shown in FIG. 10, in an embodiment, the top electrode layer 541 arranged on at least one side of the acoustic resonator and the top electrode layer 541 arranged on at least one side of the other acoustic resonator corresponding to the side of the acoustic resonator extend to the middle of the two acoustic resonators, and are connected to each other to form the suspended structure 1042. An end of the suspended structure 1042 extends towards the support layer 641 and is not connected to the support layer 641. The suspended structure 1042, the support layer 641 and the piezoelectric layer 441 form an air gap 941, and the air gap 941 may reflect the transverse wave and prevent the transverse wave from coupling energy to the substrate 141, thus improving the performance of the resonator.

Figure 11:
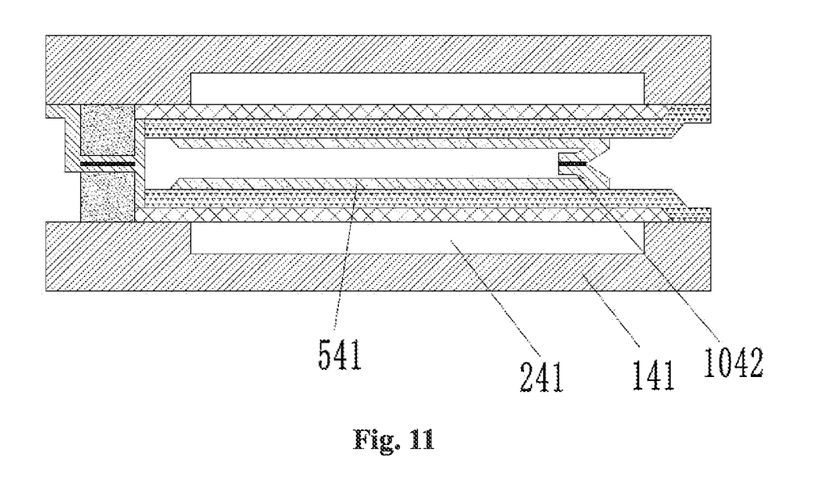
FIG. 11 is a schematic structural diagram showing that acoustic resonators are provided with a suspended structure extending towards a middle of an active area in an acoustic resonator assembly according to the fourth embodiment of the present disclosure.
Figure 12:
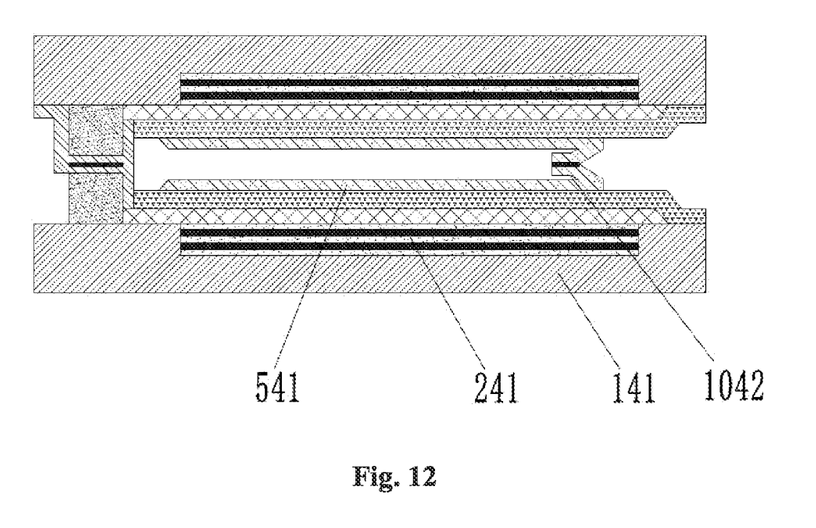
FIG. 12 is a schematic structural diagram showing that acoustic resonators are provided with a suspended structure extending towards a middle of an active area and an acoustic mirror is a Bragg reflector in an acoustic resonator assembly according to the fourth embodiment of the present disclosure.

In another embodiment, as shown in FIG. 11, a top electrode layer 541 or a lead wire 1041 connected to the top electrode layer 541 arranged on at least one side of the acoustic resonator and a top electrode layer 541 or a lead wire 1041 connected to the top electrode layer 541 arranged on at least one side of the other acoustic resonator corresponding to the side of the acoustic resonator extend to the middle of the two acoustic resonators, and are connected to each other to form the suspended structure 1042. The end of the suspended structure 1042 extends towards a middle of the active area. The end of the suspended structure 1042 extends towards the middle of the active area, so that a projection of an end of an electrode on the side in a vertical direction is located inside an acoustic mirror 241 or coincides with a boundary of the acoustic mirror 241, so as to prevent the transverse wave from coupling energy to the substrate 141, thus improving the performance of the resonator. Such case is more suitable for an SMR (Solidly Mounted Resonator) structure. As shown in FIG. 12, the Bragg reflector has a higher mechanical stability than the cavity, so that the suspended structure 1042 extending towards in the middle of the active area can be arranged on at least one side of the top electrode layer 541, and even around the top electrode layer 541.

A filter formed by the acoustic resonator assembly described above is further provided according to an embodiment of the present disclosure.

The frequency design and performance optimization of the filter are based on combination design of different resonators. The combination design and differential design of a frequency and a bandwidth are that different electrodes and different piezoelectric film thicknesses (generally two thicknesses) are first designed in an active area of each of the resonator, and the diversity of the frequency and performance of the resonator is achieved by changing the thickness. A high-performance filter can be achieved through a combination of resonators. According to the conventional technology, the resonator with two kinds of electrodes and two piezoelectric film thicknesses may be arranged on one substrate. If thicknesses of some film layers on a cavity of a resonator are adjusted on one substrate to achieve more than two thicknesses, the difficulty in design and manufacturing is greatly increased, a metal film layer stripping process (lift-off) is required to be performed multiple times, the cost is greatly increased, the yield is reduced, and the film with a complex structure has a great impact on a structure of a top electrode, thus limiting the design.

In the embodiment of the present disclosure, resonators with different electrodes and different piezoelectric film thicknesses may be respectively arranged on two substrates before the resonators are bonded to each other, at least two film thicknesses of the resonator may be respectively achieved, and at least four combinations may be achieved by modifying at least one of a series resonance frequency and a parallel resonance frequency of resonators on an upper substrate and a lower substrate. Therefore, compared with modifying at least one of the series resonance frequency and the parallel resonance frequency of all resonators on one substrate, the resonance frequencies of the resonators on two substrates are respectively modified and then the resonators are bonded to each other, so that the difficulty in design and manufacturing can be greatly reduced, and a fault tolerance rate can be improved. For example, in a case that three different thicknesses of the resonator are achieved on one substrate, up to nine combinations may be achieved according to the technical solution, which can greatly improve the degree of freedom in design and the performance of the filter, simplify the process and reduce the cost. The filter formed by any one of the acoustic resonator assemblies according to the first embodiment to the fourth embodiment is provided according to the following embodiments.

Fifth Embodiment

Figure 13:
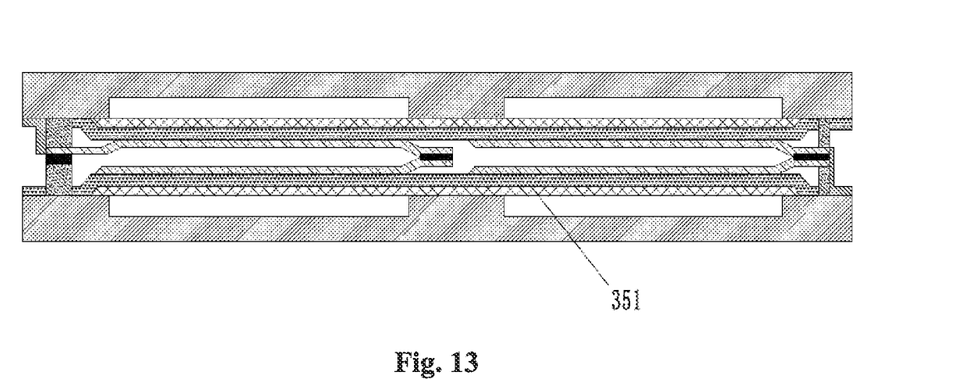
FIG. 13 is a schematic structural diagram of a filter formed by acoustic resonators provided with bottom electrode layers electrically coupled to each other according to a fifth embodiment of the present disclosure.

Based on any one of the acoustic resonator assemblies according to the first embodiment to the fourth embodiment, the embodiment is different from the first embodiment to the fourth embodiment is in that, as shown in FIG. 13, bottom electrode layers 351 of acoustic resonators of two adjacent acoustic resonator assemblies arranged side by side are arranged on one layer and connected to each other. In this case, the bottom electrode layers 351 may achieve electrical coupling between the adjacent acoustic resonator assemblies, and may form a parallel structure.

Sixth Embodiment

Figure 14:
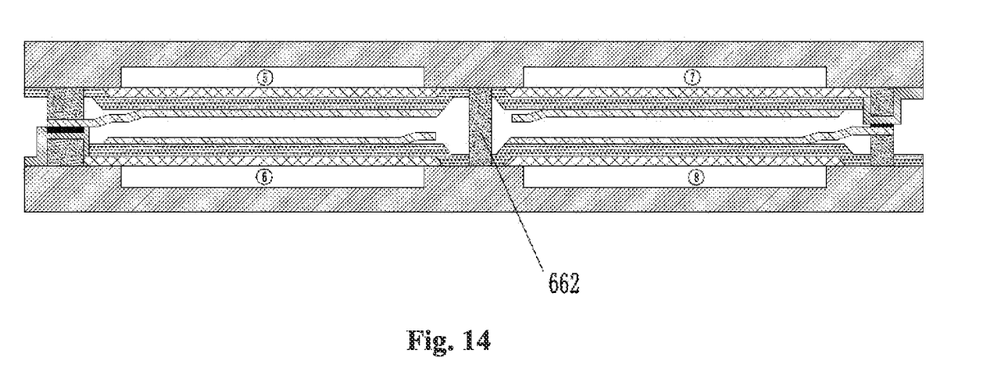
FIG. 14 is a schematic structural diagram of filters provided with a metal isolation layer arranged between acoustic resonator assemblies according to a sixth embodiment of the present disclosure.

Based on any one of the acoustic resonator assemblies according to the first embodiment to the fourth embodiment, the embodiment is different from the first embodiment to the fourth embodiment is in that, as shown in FIG. 14, a metal isolation layer 662 is arranged between filters formed by two adjacent acoustic resonator assemblies arranged side by side. An acoustic resonator ⑤ and an acoustic resonator ⑥ that are arranged at a left side form a reception filter, and an acoustic resonator ⑦ and an acoustic resonator ⑧ that are arranged at a right side form a transmission filter. The transmission filter and the reception filter are separated by the metal isolation layer 662, to isolate the transmission filter from the reception filter. Further, the metal isolation layer 662 may have a shielding effect. In addition, the reception filter, the transmission filter and the metal isolation layer are in one die. The transmission filter and the reception filter each are formed by any one of the acoustic resonator assemblies according to the first embodiment to the fourth embodiment.

Seven Embodiment

Figure 15:
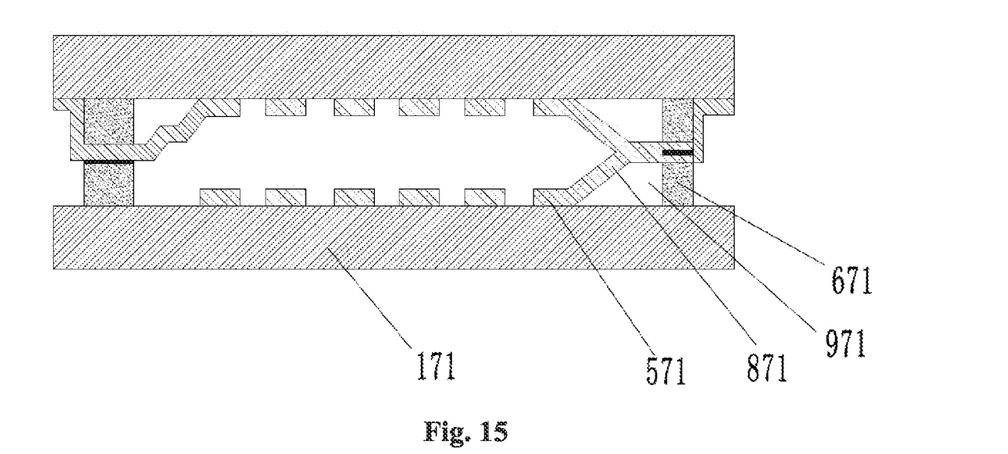
FIG. 15 is a schematic structural diagram of a filter formed by two surface acoustic wave resonators connected to each other according to a seventh embodiment of the present disclosure.

Based on any one of the acoustic resonator assemblies according to the first embodiment to the fourth embodiment, the embodiment is different from the first embodiment to the fourth embodiment is in that the acoustic resonator further includes a surface acoustic wave resonator. As shown in FIG. 15, an interdigital transducer of the surface acoustic wave resonator is provided with a connection part 871 extending from at least one side of the interdigital transducer 571 through a support layer 671 to the outside. The connection part 871 forms an air gap 971 with a substrate 171 and the support layer 671, so that one surface acoustic wave resonator and another surface acoustic wave resonator can be connected in series with each other or in parallel with each other.

Figure 16:
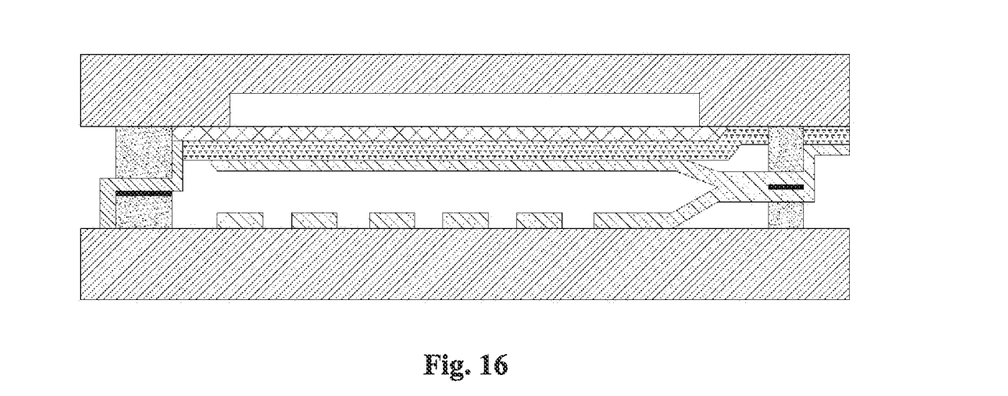
FIG. 16 is a schematic structural diagram of a filter formed by a bulk acoustic resonator connected to a surface acoustic wave resonator according to the seventh embodiment of the present disclosure.

A filter is further provided according to an embodiment of the present disclosure, and includes the acoustic resonator according to any one of the embodiments described above. The acoustic resonator assemblies described above are applicable to any structure and any type of BAW (Bulk Acoustic Wave Device) filter, the BAW filter includes FBAR (Thin Film Bulk Acoustic Resonator), SMR-BAW (Solidly Mounted Resonator-Bulk Acoustic Wave Device), CRF (Coupled Resonator Filter), SCF (Stacked Crystal Filter), SBAR (Stacked Bulk Acoustic Resonator), RBAR (Reverse Bulk Acoustic Resonator), DBAR (Dual Bulk Acoustic Resonator), and the like, and also to any mems type of device, such as a SAW (Surface Acoustic Wave) resonator, a piezoelectric device, and a sensors that are made of any piezoelectric materials, such as ZnO, PZT, lithium carbonate LN, and lithium niobate LT. In an embodiment, the acoustic resonator in the filter includes at least one surface acoustic wave resonator. In an embodiment, as shown in FIG. 16, a connection structure between a bulk acoustic resonator and a surface acoustic wave resonator is shown, so that the surface acoustic wave resonator and the bulk acoustic resonator can be connected in series with each other or in parallel with each other.

An acoustic resonator assembly and a filter are provided according to the present disclosure. The acoustic resonator assembly includes at least two acoustic resonators that are vertically bonded to each other, a support layer is arranged on a substrate or a piezoelectric layer on a periphery of a projection of an acoustic mirror on the substrate, and at least two acoustic resonators are vertically bonded to each other through a bonding layer arranged on the support layer. The filter is formed by bonding, to greatly reduce an area of the filter, and thus an area of each resonator can be increased by appropriately sacrificing an area reduction rate of the resonator. Before the resonators are bonded to each other, acoustic resonators with different electrodes and different piezoelectric film thicknesses may be respectively arranged on two substrates, at least two film thicknesses of the resonator may be respectively achieved, and at least four combinations may be achieved by modifying at least one of a series resonance frequency and a parallel resonance frequency of the acoustic resonators on an upper substrate and a lower substrate. Therefore, compared with modifying at least one of the series resonant frequency and the parallel resonant frequency of all acoustic resonators on one substrate, the resonance frequencies of the acoustic resonators on two substrates are respectively modified and then the acoustic resonators are bonded to each other, so that the difficulty in design and manufacturing can be greatly reduced, and a fault tolerance rate can be improved, which can greatly improve the degree of freedom in design and the performance of the filter, simplify the process and reduce the cost. The area of the filter formed by bonding can be effectively reduced by about 40% and a volume of the filter can be reduced by about 65%, so that the filter can occupy a small space in the front-end module, thus improving a space utilization.

The specific embodiments of the present disclosure are described above, and the protection scope of the present disclosure is not limited thereto. Any changes or substitutions that may be easily conceived by those skilled in the art within the technical scope disclosed in the present disclosure should fall within the protection scope of the present disclosure. Therefore, the protection scope of the present disclosure should be subject to the protection scope of the claims.

In the description of the present disclosure, it should be noted that an orientation or a positional relationship indicated by the terms, such as "upper", "lower", "inner", and "outer", are based on the orientation or positional relationship shown in the drawings, which are only to facilitate the description of the present disclosure and to simplify the description, rather than indicating or implying that devices or elements indicated by the terms must have a specific orientation, or be constructed and operated in a specific orientation. Therefore, the terms should not be construed as a limitation to the present disclosure. The word 'including' does not exclude the presence of elements or steps not listed in the claims. The preceding word 'a' or 'an' of an element does not exclude the existence of multiple such elements. The mere fact that some measures are recorded in dependent claims different from each other does not indicate that a combination of these measures cannot be used for improvement. Any reference signs in the claims should not be construed as limiting the scope.

The invention claimed is:

1. An acoustic resonator assembly, comprising at least two acoustic resonators that are vertically connected to each other,
wherein for each of the at least two acoustic resonators,
an acoustic resonator comprises: an acoustic mirror, a bottom electrode layer, a piezoelectric layer and a top electrode layer that are arranged on a substrate;
an active area of the acoustic resonator is defined by an overlapping area of the acoustic mirror, the bottom electrode layer, the piezoelectric layer and the top electrode layer; and
the acoustic resonator further comprises a support layer, the support layer is arranged on the substrate or the piezoelectric layer on a periphery of a projection of the acoustic mirror on the substrate;
wherein the at least two acoustic resonators are vertically connected to each other through the support layer; and
wherein a top electrode layer or a lead wire connected to the top electrode layer arranged on at least one side of the acoustic resonator and a top electrode layer or a lead wire connected to the top electrode layer arranged on at least one side of the other acoustic resonator corresponding to the side of the acoustic resonator extend to a middle of the two acoustic resonators, and are connected to each other to form a suspended structure.

2. The acoustic resonator assembly according to claim 1, wherein the top electrode layer of the acoustic resonator is provided with an outer connection part, and the outer connection part extends from at least one side of the top electrode layer to an upper side of the support layer and extends to the outside through the support layer, and is connected to the outside.

3. The acoustic resonator assembly according to claim 2, wherein the outer connection part is in a stepped structure, and an air gap is formed by the outer connection part, the piezoelectric layer and the support layer.

4. The acoustic resonator assembly according to claim 3, wherein the stepped structure of the outer connection part is provided with at least two steps.

5. The acoustic resonator assembly according to claim 3, wherein at least a part of a projection of the air gap on the substrate is located inside the acoustic mirror or at a boundary of the acoustic mirror.

6. The acoustic resonator assembly according to claim 3, wherein the air gap is filled with a material with low dielectric constant.

7. The acoustic resonator assembly according to claim 1, wherein the top electrode layer of the acoustic resonator is provided with a mass load part, the mass load part is arranged on a lead wire that extends from the piezoelectric layer through the support layer, and an air gap is formed by the lead wire, the piezoelectric layer and the support layer.

8. The acoustic resonator assembly according to claim 7, wherein at least a part of a projection of the air gap on the substrate is located inside the acoustic mirror or at a boundary of the acoustic mirror.

9. The acoustic resonator assembly according to claim 7, wherein the air gap is filled with a material with low dielectric constant.

10. The acoustic resonator assembly according to claim 1, wherein an end of the suspended structure extends towards the support layer and is not connected to the support layer.

11. The acoustic resonator assembly according to claim 1, wherein an end of the suspended structure extends towards a middle of the active area.

12. The acoustic resonator assembly according to claim 1, wherein at least two acoustic resonators are vertically connected to each other by bonding or welding.

13. The acoustic resonator assembly according to claim 1, wherein at least two vertically connected acoustic resonators are bonded to each other through a bonding layer arranged on the support layer, and after two acoustic resonators are bonded to each other, a distance between a top electrode layer of one acoustic resonator and a top electrode layer of the other acoustic resonator ranges from 10 μm to 20 μm in the active area.

14. The acoustic resonator assembly according to claim 1, wherein electrodes of the acoustic resonator and electrodes of another acoustic resonator are connected to each other in a plurality of ways, to form at least one of a series structure and a parallel structure.

15. A filter formed by an acoustic resonator assembly wherein the acoustic resonator assembly comprises at least two acoustic resonators that are vertically connected to each other,
wherein for each of the at least two acoustic resonators,
an acoustic resonator comprises: an acoustic mirror, a bottom electrode layer, a piezoelectric layer and a top electrode layer that are arranged on a substrate;
an active area of the acoustic resonator is defined by an overlapping area of the acoustic mirror, the bottom electrode layer, the piezoelectric layer and the top electrode layer; and
the acoustic resonator further comprises a support layer, the support layer is arranged on the substrate or the piezoelectric layer on a periphery of a projection of the acoustic mirror on the substrate;
wherein the at least two acoustic resonators are vertically connected to each other through the support layer; and
wherein a top electrode layer or a lead wire connected to the top electrode layer arranged on at least one side of the acoustic resonator and a top electrode layer or a lead wire connected to the top electrode layer arranged on at least one side of the other acoustic resonator corresponding to the side of the acoustic resonator extend to a middle of the two acoustic resonators, and are connected to each other to form a suspended structure.

16. The filter according to claim 15, wherein a metal isolation layer is arranged between filters formed by two adjacent acoustic resonator assemblies arranged side by side.

17. The filter according to claim 15, wherein bottom electrode layers of acoustic resonators of two adjacent acoustic resonator assemblies arranged side by side are arranged on one layer, and connected to each other.

18. The filter according to claim 15, wherein the acoustic resonator further comprises a surface acoustic wave resonator, an interdigital transducer of the surface acoustic wave resonator is provided with a connection part extending from at least one side of the interdigital transducer to an upper side of the support layer and being connected to the outside, and an air gap is formed by the connection part, the substrate and the support layer.

19. The filter according to claim 18, wherein the acoustic resonator in the filter comprises at least one surface acoustic wave resonator.

* * * * *